(12) United States Patent
Chan et al.

(10) Patent No.: US 7,589,611 B2
(45) Date of Patent: Sep. 15, 2009

(54) OVERVOLTAGE PROTECTION MATERIALS AND PROCESS FOR PREPARING SAME

(75) Inventors: Chi-Ming Chan, Kowloon (HK); Kai-Mo Ng, New Territories (HK); Catherine Yuen-Chien Wong, New Territories (HK); Ying Kit Cheung, Central (HK)

(73) Assignee: The Hong Kong Universtiy of Science and Technology, Hong Kong (CN)

( * ) Notice: Subject to any disclaimer, the term of this patent is extended or adjusted under 35 U.S.C. 154(b) by 0 days.

(21) Appl. No.: 11/468,736

(22) Filed: Aug. 30, 2006

(65) Prior Publication Data

US 2007/0102675 A1 May 10, 2007

Related U.S. Application Data

(63) Continuation of application No. 10/274,904, filed on Oct. 21, 2002.

(51) Int. Cl.
*H01C 7/10* (2006.01)
(52) U.S. Cl. .................................................. 338/22 R
(58) Field of Classification Search ................ 338/22 R
See application file for complete search history.

(56) References Cited

U.S. PATENT DOCUMENTS

| | | |
|---|---|---|
| 3,451,964 A | 6/1969 | Creamer |
| 3,655,497 A | 4/1972 | Forrest |
| 4,514,620 A | 4/1985 | Cheng et al. |
| 4,726,991 A | 2/1988 | Hyatt et al. |
| 4,849,470 A | 7/1989 | Murphy |
| 5,294,374 A | 3/1994 | Martinez et al. |
| 5,436,609 A | 7/1995 | Chan et al. |
| 5,443,876 A | 8/1995 | Koskenmaki et al. |
| 5,928,567 A | 7/1999 | Flottman et al. |
| 5,981,678 A * | 11/1999 | Keller et al. .................... 528/5 |
| 6,124,780 A | 9/2000 | Duggal et al. |
| 6,133,820 A * | 10/2000 | Duggal et al. ............. 338/22 R |
| 6,323,751 B1 | 11/2001 | Duggal et al. |
| 6,373,372 B1 | 4/2002 | Duggal et al. |
| 6,451,505 B1 * | 9/2002 | Patel et al. ................ 430/273.1 |
| 6,452,476 B1 | 9/2002 | Handa |
| 6,778,062 B2 * | 8/2004 | Handa et al. ............... 338/22 R |
| 6,842,103 B2 * | 1/2005 | Yoshinari et al. .......... 338/22 R |
| 2004/0075085 A1 | 4/2004 | Chan et al. |
| 2006/0151755 A1 | 7/2006 | Chan et al. |
| 2007/0047762 A1 | 3/2007 | Au et al. |
| 2007/0123057 A1 | 5/2007 | Chan et al. |
| 2007/0138440 A1 | 6/2007 | Chan et al. |
| 2007/0148440 A1 | 6/2007 | Chan et al. |

OTHER PUBLICATIONS

U.S. Appl. No. 10/274,904, filed Oct. 21, 2002, Chan, et al.
U.S. Appl. No. 11/622,970, filed Jan. 12, 2007, Chan, et al.
U.S. Appl. No. 11/624,632, filed Jan. 18, 2007, Chan, et al.
U.S. Appl. No. 11/624,640, filed Jan. 18, 2007, Chan, et al.

* cited by examiner

*Primary Examiner*—Elvin G Enad
*Assistant Examiner*—Joselito Baisa
(74) *Attorney, Agent, or Firm*—Schwabe Williamson & Wyatt P.C.

(57) ABSTRACT

The invention provides a process for preparing an overvoltage protection material comprising:
  (i) preparing a mixture comprising a polymer binder precursor and a conductive material; and
  (ii) heating the mixture to cause reaction of the polymer binder precursor and generate a polymer matrix having conductive material dispersed therein,
wherein the polymer binder precursor is chosen such that substantially no solvent is generated during the reaction.

22 Claims, 2 Drawing Sheets

OVERVOLTAGE PROTECTION MATERIALS AND PROCESS FOR PREPARING SAME

CROSS-REFERENCE TO RELATED APPLICATIONS

The present application is a continuation of U.S. application Ser. No. 10/274,904 filed Oct. 21,2002 titled, "Overvoltage Protection Materials and Process for Preparing Same" by Chi-Ming Chan et al. assigned to the assignee of the claimed and/or disclosed subject.

FIELD OF THE INVENTION

The present invention relates to materials for protecting sensitive electronic circuits against transient high electrostatic pulses. More particularly, it relates to a new solvent-free methodology for producing these materials, and devices comprises these materials.

BACKGROUND OF THE INVENTION

Transient high voltages can induce harmful currents and voltages in electronic circuits and electric equipment. Normally, these transient voltages are caused by electrostatic discharge, lightning or inductive power surges.

Overvoltage protection materials and devices have been developed which aim to protect such electronic and electrical equipment from these transient high voltages. The overvoltage materials have non-linear electrical resistance characteristics, specifically having a very high electrical resistance (e.g. >30 MOhm) at a normal operating voltages (e.g. <200 V for normal electronic instrument), but switching to an essentially conducting state when subject to a transient high voltage. The voltage at which the material changes from its high resistance state (or "off state") to its conducting state (or "on state") is known as the threshold value, or trigger voltage. It is necessary for the materials to have a very fast switching time between the high resistance state and conducting state in order to provide adequate protection for the electronic or electrical equipment being protected. An acceptable switching time is usually of the order of nanoseconds, and is preferably less than one nanosecond. The device returns back to its normal high resistance state after the transient high voltage threat has passed.

The term overvoltage protection material usually refers to a composite material containing a conductive material within a polymer matrix system. The overvoltage protection material may comprise only a two components (the conductive material and the polymer matrix), or can contain other components such as a semi-conductive material or a non-conductive material.

Conventional methods for preparing overvoltage protection materials include solvent processing or polymer condensation processes. Usually, the finished polymeric systems should be a network structure or a thermoset in order to achieve good thermal properties. Therefore, both of these processing techniques should be carried out in the presence of a cross-linking component.

(a) Solvent Processing Method

One method of making thermoset plastics suitable for use as overvoltage protection materials is a solvent processing method, as described in U.S. Pat. Nos. 4,977,357 and 5,248, 517. The overvoltage conductive materials are prepared by mixing a dissolved silicone polymer solution, nickel powder, silicon carbide powder; inorganic filler and cross-linking agent (e.g. organic peroxide) to form a paste like composition. This material is then applied to a prepared substrate which contains metal electrodes, to form an uncured device. The device is then cured in an oven at 125° C. for 4 hours.

However, this solvent processing technique has a number of disadvantages. First, the polymer must be dissolved in a suitable solvent, the choice of which is critical to the success of the reaction. Not all solvents can be used (e.g. all chlorinate and some ketone-type solvents are unsuitable), and it can take a great deal of time to determine which solvents are suitable. Second, a relatively large amount of solvent must be removed (e.g. sometime as much as 1:1, solid to solvent weight content) under the high temperature curing step. Removal of solvent can be damaging to the device, generating voids within polymer matrix and causing a resulting degradation in performance of the final overvoltage protection device. Third, the processing temperature condition required to evaporate the solvent is relatively high, and the curing time is relatively long (e.g. approximately 4 hours at 125° C.).

(b) Polycondensation Process Method

U.S. Pat. No. 5,928,567 discloses a liquid conductive material designed to protect electrical components from high pulse static electricity. The process comprises combining a solvent-free liquid silicone polymer composition (General Electric RTV11), a conductive metallic powder, a non-conductive inorganic powder and a catalytic amount of the curing agent (e.g. dibutyl tin dilaurate) and mixing these components in a conventional multi-blade mixer. The paste like material is applied to an appropriate substrate, and is then cured in a convection oven at 80° C. for 2 hours. The process is described as solvent free because no conventional organic solvent is added in the process described.

However, while no solvent is added to the mixture, the process itself will generate solvent as a by-product. In the process specifically described in this patent, the polymerization process is a common condensation reaction between di- or tri-hydroxy polydimethylsiloxane and di- or tri-methoxy polydimethylsiloxane prepolymers. A general reaction scheme is shown below in Scheme 1.

Scheme 1

From this it can be seen that, although a solvent is not required as an initial component of the reaction mixture, some solvent (in this case methanol) will be generated during the course of the curing reaction. In this instance, one mole of solvent is generated for every mole of product. During the curing reaction the solvent present in the mixture will evaporate and in doing so will generate unwanted voids or bubbles in the polymer matrix. This in turn diminishes the ability of the device to respond properly during conditions of transient high voltage.

From a consideration of the prior art processes it can be seen that performance of overvoltage protection devices is reduced due to the presence of solvent either as an added component of the reaction mixture, or as a by-product formed during the curing process. It is therefore an object of the invention to provide an improved and convenient method for preparing overvoltage protection materials. In particular, it is an object of the invention to provide a solvent-free, or "clean", process for preparing an overvoltage protection material suitable for protecting electronic circuits and electrical devices from transient high voltages, where no solvent is added to the reaction mixture, and where no substantially solvent is generated during the course of the process. It is another object of the invention to provide an improved overvoltage protection material. It is also an object of the invention to provide new overvoltage protection devices comprising this improved overvoltage protection material.

SUMMARY OF THE INVENTION

The invention provides a process for preparing an overvoltage protection material comprising:
(i) preparing a mixture comprising a polymer binder precursor and a conductive material; and
(ii) heating the mixture to cause reaction of the polymer binder precursor and generate a polymer matrix having conductive material dispersed therein, wherein the polymer binder precursor is chosen such that substantially no solvent is generated during the reaction.

The invention also provides a process for preparing an overvoltage protection device comprising:
(i) depositing a metallic layer on a substrate, and etching the metallic layer in order to provide metallic electrodes separated by gaps;
(ii) preparing a mixture comprising at least one polymer binder precursor and a conductive material, and applying this mixture between and in contact with adjacent electrodes; and
(iii) heating the device to cause reaction of the polymer binder precursor and generate an overvoltage protection material comprising a polymer binder having conductive material dispersed therein;

wherein the polymer binder precursor is chosen such that substantially no solvent is generated during the reaction.

In another embodiment, the invention provides an overvoltage protection material preparable according to a process comprising:
(i) preparing a mixture comprising at least one polymer binder precursor and a conductive material; and
(ii) heating the mixture to cause reaction of the polymer binder precursor and generate a polymer matrix having conductive material dispersed therein, wherein the polymer binder precursor is chosen such that substantially no solvent is generated during the reaction.

In a further embodiment, the invention provides an overvoltage protection material comprising a polymer binder having a conductive material dispersed therein, said overvoltage protection material being obtainable by an addition polymerisation reaction of a mixture comprising a polymer binder precursor and a conductive material.

In each embodiment above, the mixture of polymer binder precursor and conductive material is preferably substantially solvent-free. The invention also relates to the polymer binders described and prepared in the methods above.

The invention also provides an overvoltage protection material comprising a polymer binder having a conductive material dispersed therein, said material being substantially free of voids.

Finally, in another embodiment the invention provides a circuit comprising electronic components, at least a first and second conducting region, an amount of an overvoltage protection material being disposed between and in contact with said conducting regions, the overvoltage protection material being as described above.

DETAILED DESCRIPTION OF THE INVENTION

The present invention describes new processes for producing overvoltage protection materials, and more specifically describes some very unique and clean organic synthetic methodologies for preparing cross-linked polymeric and highly robust networked systems, and to the formation of conductive composite matrix materials which are free of unwanted contaminants. The materials produced according to the invention are useful as overvoltage protection materials, behaving like electrical insulators under normal operation, but switching to became conductors under high transient voltage. The materials also have a high degree of heat resistance (many thermoplastic polymers become soft or even melt at temperatures of about 80° C. to about 200° C.). Furthermore, the simplified processing steps used in the process of the invention reduce unnecessary contaminants in the final cured composite materials.

The process of the invention relates to the synthesis of a highly cross-linked polymer system which contains a conductive material, with the resulting composite material being useful as an overvoltage protection material. During the process, no solvent is required in order to produce the resulting composite material, nor is any substantial amount of solvent generated as a by-product of the reaction. The phrase "substantially no solvent" is intended to mean that no significant amount of solvent is generated during the reaction. If any solvent is generated, this is present in a very small amount, generally less than about 2 wt %, and preferably less than about 1 wt %, based on the total weight of the composite material. Obviously it is preferred to prevent any solvent being generated at all.

Reducing the amount of solvent generated during the process has a number of advantages. For example it reduces the likelihood of unwanted voids or bubbles being produced in the resulting composite material, such voids or bubbles being caused by fast evaporation of solvent during the curing process. By reducing the presence of these irregularities in the composite material, the electrical properties of overvoltage protection devices made from this material are improved. When an overvoltage protection material of the invention is described as being substantially free of voids, this is intended to mean that voids account for less than 5% of the volume of the material, preferably less than 1% of the volume of the material. Clearly, it is advantageous to ensure that the material is entirely free of voids, however if voids are present, they are preferably less than about 1 mm in diameter, more preferably less than about 1 µm in diameter.

Polymeric Binder

The polymeric binder used in the invention serves two major roles: first it acts as a media for separation of the conductive particles, and second it provides enhanced thermal resistance against shape deformation of the polymer matrix system. The term "polymer binder" when used herein refers to a cross-linked polymer structure, also known as a polymer matrix, in which is dispersed the conductive material. The polymer binder is prepared from a polymer binder precursor. The term "polymer binder precursor" represents a precursor composition which, upon heating, reacts to form the cross-linked polymer binder, or polymer matrix. The precursor may comprise a single type of monomer, oligomer or prepolymer, or may comprise a mixture of different monomers, oligomers and/or prepolymers. It may also comprise other components which may be required to form the polymer binder, such as cross-linking agents and/or catalysts.

There are numerous techniques and synthetic methodologies known in the art for producing thermoset polymer systems. However, it is a requirement of the present invention that the reaction takes place without a significant amount of solvent being generated during the reaction. Furthermore, it is preferred that the entire reaction is carried out under substantially solvent-free conditions (i.e. with substantially no solvent being present at the beginning of the reaction, and substantially no solvent being generated during the reaction). A synthetic route which is therefore suitable is an addition polymerization reaction. Such a reaction may be carried out in the absence of solvent (i.e. no solvent is required to dissolve the reactants prior to curing).

Addition polymerization reactions differ from those described in the prior art such as U.S. Pat. No. 5,928,567 because substantially no solvent is generated as a by-product. As shown in Scheme 1 above, polycondensation reactions involve the reaction of two molecules with the elimination of a solvent molecule, thus a significant amount of solvent is generated as a by-product. In contrast, the polymer addition reactions of the present invention involve the reaction of at least two molecules without elimination of a solvent molecule.

The polymer binders of the present invention can be prepared from a variety of different polymerizable functional monomers, oligomers or prepolymers according to a number of different methodologies. When used in the present invention, the polymer binder precursors are reacted to form the polymer binder in the presence of the conductive material, in order to form a matrix having conductive material dispersed therein. However, the following addition polymerisation reactions will be described generally, without stating the presence of the conductive material which will, in the processes of the invention, always be present.

Reactions which are particularly suitable in the process of the invention include bulk free radical polymerisation, polyurethane synthesis, epoxy resin synthesis and polyhydrosilylation.

Bulk Free-Radical Polymerization:

Many "bulk" (i.e. solvent-free) free-radical polymerisation reactions are known and could be used in the present invention. Some reactions which are particularly useful in the present invention involve alkyl acrylates or alkyl methacrylates monomers or liquid formed prepolymers carrying acrylate or methacrylate functional groups.

In a typical "bulk" free radical polymerization, monomers or oligomers of acrylates or methacrylates may be reacted in the presence of methacrylate- or acrylate-based cross-linking agents and a free radical type catalyst (e.g. peroxides or AIBN). The formation of the copolymer can be best represent by the following reaction scheme 2:

The acrylate and methacrylate components are preferably selected from the group consisting of methyl acrylate, ethyl acrylate, butyl acrylate, 2-ethylhexyl acrylate, methyl methacrylate, ethyl methacrylate, butyl methacrylate and 2-ethylhexyl methacrylate.

The crosslinking agent is a compound having more than one functional group, and is preferably selected from the group consisting of 1,4-butanediol diacrylate, 1,4-butylene glycol diacrylate, ethylene diacrylate, 1,6-hexamethylene diacrylate, 1,4-butanediol dimethacrylate, 1,4-butylene glycol dimethacrylate, ethylene dimethacrylate, 1,6-hexamethylene dimethacrylate, trimethylpropane trimethacrylate, pentacrythediol tetraacrylate and pentacrythediol tetramethacrylate.

In general, the reaction can be easily initiated by heating the content mixture. Normally, the initiating temperatures are all depends on the type of the radical initiator use which can be ranging from 40° C. to over 150° C.

Polyurethanes Synthesis:

Polyurethanes are among the most common polymers in the global polymer market. Polyurethanes can be synthesised according to a well established addition process between isocyanates and polyols. A wide range of isocyanate and polyol compounds are known in the art, and these compounds may contain aliphatic and/or aromatic moieties.

Polyurethane formation usually occurs via a step growth polymerization process in which the chain length of the polymer increases as the reaction progresses. The polymer may be a linear, or slightly branched, thermoplastic material, or may be in the form of a cross-linked thermoset network. To be suitable for use in the overvoltage protection devices of the present invention, the polyurethane should be an electrical insulator.

The most widely used method of synthesising polyurethanes is by the reaction of a diisocyanate and a polyol, and this synthetic reaction may be used in the present invention. Thus, in a preferred embodiment the polymer binder precursor comprises a diisocyanate component and a polyol component. These components can react together to form a polyurethane polymer binder. The reactants are preferably used in their liquid forms, and may be present as monomers, oligomers or prepolymers.

The diisocyanate component is preferably selected from the group consisting of 1,4-diisocyanatobutane, 1,6-diisocyanatohexane, 1,8-diisocyanatooctane, 1,12-diisocyanatododecane, 2,4-toluene diisocyanate, isophorone diisocyanate terminated poly(1,4-butandiol), tolylene 2,4-diisocyanate terminated poly(1,4-butandiol), and other commercially available diisocyanates such as those available under the trade marks Desmodur® L67BA, ISONATE® M342 and ISONATE® 143L. The diisocyanate component is preferably present in the reaction mixture in an amount of from 5 to 50 wt %, based on the total weight of the reactants.

The polyol component may be a diol, and is preferably selected from the group consisting of short chain dihydroxy alcohols such as 1,2-ethandiol, 1,3-propandiol, 1,2-propandiol, 1,4-butandiol. The polyol component may also be selected from the group consisting of poly(ethylene glycol) (e.g. having $M_n$ ~200-400), hydroxy terminated poly(dimethylsiloxane) (e.g. having $M_n$ ~500-10,000) and dihydroxy terminated poly(dimethylsiloxane-co-diphenylsiloxane), or may be a polyol which is commercially available under trade marks such as Terathane® 650 Polyether glycol, Terathane® 1000 Polyether glycol, Terathane® 2000 Polyether glycol, Desmophen® 1600U and Desmophen® 1900U. The polyol component is preferably present in the reaction mixture in an amount of from 1 to 50 wt %, based on the total weight of the reactants.

In a preferred embodiment, the polymer binder precursor may additionally comprise a cross-linking agent. The cross-linking agent is a multi-functional cross-linking compound, and is preferably selected from compounds having a functionality of more than two. For example, the cross-linking agent may be selected from compounds having more than two functional groups such as hydroxy or isocyanate groups. Particularly preferred cross-linking agents include monomers, oligomers or prepolymers having more than two isocyanate groups, and in particular tri- and tetra-functional compounds such as polymethylene polyphenylisocyanates. Representative compounds are commercially available from Dow Chemical under the trade mark PAPI (e.g. PAPI 27 and PAPI 2940).

Another group of preferred cross-linking agents consists of compounds containing more than two hydroxy groups, and in particular tri- and tetra-functional compounds, such as 1,2,3-propantriol and polycaprolactone triol (e.g. having $M_w$ ~300), and branched polyalcohol compounds available from Aldrich under the trade mark Desmophen (e.g. Desmophen 550U, Desmophen 1910U, Desmophen 1145 and Desmophen 1150).

These cross-linking agents may be employed in the reaction scheme in any amount sufficient to provide compositions having the desired material properties, but are preferably present in an amount of from 0.1 to 10 wt %.

Many catalysts can be used to catalyse the reaction of the isocyanate and polyol components. Preferred catalysts are those based on metals such as tin and zinc, and in particular tin (II) octate and zinc (II) octate catalysts. Dibutyltin dilaurate is also preferred. The amount of catalyst may be determined by those skilled in the art, but is preferably from about 0.01 to 5 wt %, based on the total weight of the reactants.

In a typical cross-linked type polyurethane synthesis, the procedure normally consists of four components: (1) a monomeric or oligomeric diisocyanate, (2) a monomeric or oligomeric diol, (3) a cross-linking agent, and (4) a catalyst. An exemplary synthetic scheme is shown in Scheme 3 below.

Scheme 3

The R groups in this scheme can be any type of repeating units, for example a straight-chain or branched alkyl group. They may be based on a number of molecules such as polyethylene glycol, polydimethylsiloxane, polytetrahydrofuran (e.g. Terathane® Polyether glycol) or polyester. The preferred groups are those based on low molecular Terathane® Polyether glycol, polyethylene glycol and polydimethylsiloxane.

Polyhydrosilylation:

The addition polymerisation reaction used to prepare the polymer binder of the invention may alternatively be a polyhydrosilylation reaction. Hydrosilylation is a well-known methodology in organic synthesis which takes place under mild conditions. In a hydrosilylation reaction Si—H and terminal carbon-carbon double bonds react to produce various alkylsilane compounds.

Prepolymers or oligomers which may be used in such a reaction include materials selected from the group consisting of 1,5-hexandiene, 1,7-octandiene, 1,4-divinylbenzene, 1,3-divinylbenzene, 1,3-divinyl-1,1,3,3-tetramethyldisiloxane, 1,3-divinyl-1,1,3,3-tetraphenyldisiloxane, 1,3-divinyl-1,3-dimethyl-1,3-diphenyldisiloxane, 1,3-divinyl-1,1-dimethyl-3,3-diphenyldisiloxane, poly(dimethylsiloxane) divinyl terminated, poly(dimethylsiloxane-co-diphenylsiloxane) divinyl terminated and poly(dimethylsiloxane-co-methylphenylsiloxane) divinyl terminated (these compounds providing the C=C bond necessary for the hydrosilylation reaction).

Other preferred prepolymers or oligomers include compounds selected from the group consisting of 1,4-bis(dimethylsilyl)benzene, 1,3-Bis(dimethylsilyl)benzene, 1,1,3,3-tetramethyldisiloxane, 1,1,3,3-tetraphenyldisiloxane, 1,3-dimethyl-1,3-diphenyldisiloxane, 1,1-dimethyl-3,3-diphenyldisiloxane, poly(dimethylsiloxane) dihydride terminated, dihydride terminated poly(dimethylsiloxane-co-diphenylsiloxane) and dihydride terminated poly(dimethylsiloxane-co-methylphenylsiloxane), (these components providing the Si—H bond necessary for the hydrosilylation reaction).

In one example, the hydrosilylation reaction can involve the reaction of a hydrosilane and a vinylsilane which can react together to form a polycarbosilane polymer binder. In a preferred polymer synthesis, hydrosilylation occurs between α,ω-divinyl compounds and α,ω-bis(hydrosilyl) compounds in the presence of suitable cross-linking agents and catalysts, to afford thermally stable polycarbosilanes.

In a general hydrosilylation methodology, vinylsilanes and hydrosilanes are reacted together, usually in the presence of a transition metal catalyst (see scheme 4). The reaction involves the addition of Si—H bonds (e.g. from the hydrosilane component) to C=C double bonds (e.g. from the vinylsilane component).

Scheme 4

-continued

R and R' can be selected from a number of substituents known to those in the art, although alkyl groups and phenyl groups are particularly preferred. In particular, methyl, ethyl, propyl, butyl or phenyl groups may be used.

Hydrosilylation methodology can thus be used for the preparation of the polycarbosiloxanes or polycarbosilanes, which contain Si—C bonds in the polymer backbone structures. Such polycarbosiloxanes or polycarbosilanes can be obtained by reaction of a di-, tri-, tetra-, or poly-methylhydrosilyl-containing organopolysiloxane, and a di-, tri-, tetra-, or poly-vinyl-containing organopolysiloxane. The resulting polycarbosiloxane or polycarbosilane polymeric binders are preferably thermoset polymers or rubbers, and are electrical insulators (that is, they have an electrical conductivity of generally less than about $10^{-9}$ $(\Omega \cdot cm)^{-1}$).

The methylhydrosilyl-containing organopolysiloxane component preferably comprises a compound of formula (a), (b) or (c):

(a)

In the formulae (a), each R group is independently selected from a substituted or unsubstituted monovalent hydrocarbon group. Each R group preferably contains from 1 to 8 carbon atoms, with exemplary groups including alkyl groups such as methyl, ethyl, propyl, butyl, hexyl and octyl, aryl groups such as phenyl, tolyl and naphthyl, and aralkyl groups such as benzyl and phenylethyl. The preferred R groups are methyl and phenyl groups. The letter x is an integer which can range between 0 and 1000, and is preferably between 0 and 200.

Reactive monomers like 1,1,3,3-tetramethyldisiloxane, 1,1,3,3-tetraphenyldisiloxane, 1,3-dimethyl-1,3-diphenyldisiloxane, 1,1-dimethyl-3,3-diphenyldisiloxane, poly(di-methylsiloxane) dihydride terminated, poly(dimethylsiloxane-co-diphenylsiloxane) dihydride terminated and poly(dimethylsiloxane-co-methylphenylsiloxane) dihydride terminated are particularly useful in this present invention.

(b)

In formula (b), R is as defined above in relation to formula (a), n is an integer of at least 2, m is an integer inclusive of 0, and the sum of n plus m is between 3 to 8. Reactive molecules like 2,4,6,8-tetramethylcyclotetrasiloxane, pentamethylcyclopentasiloxane and 2,4,6,8,10,12-hexamethylcyclohexasiloxane are possible compounds of formula (b).

(c)

In formula (c), R is as defined above, and each R' group is independently a hydrogen atom, or a methyl or trimethylsilyl group. The proportion of x (i.e. the wt % of the methylhydrosiloxane monomer unit) in the molecule ranges from 10 to 95 wt %, preferably from 10 to 50 wt %.

The vinyl-containing organopolysiloxane preferably has a formula according to either of the formulae (d), (e) and (f) below:

(d)

Formula (d) represents a vinyl-terminated siloxane component wherein each R group is independently selected from a substituted or unsubstituted monovalent hydrocarbon group. The R group preferably contains from 1 to 8 carbon atoms, with preferred examples including alkyl groups such as methyl, ethyl, propyl, butyl, hexyl and octyl, and aryl groups such as phenyl, tolyl and naphthyl. The letter x is 0 or an integer ranging from 1 to 1000, and is preferably between 0 and 200, and the proportion of the vinyl group (in wt % based on the total weight of the vinyl-containing organopolysiloxane component) ranges from 0.1 to 30 wt %.

(e)

Formula (e) represents a vinyl-containing cycloorganosiloxane component, wherein n is an integer of at least 2, m is an 0 or an integer between 1 and 6, and the sum of n plus m is between 4 and 8.

(f)

In formula (f), each R group is as defined above in relation to formula (d), and each R' group is independently selected from allyl, vinyl, methyl, and trimethylsilyl groups. The value of y is chosen such that the proportion of the vinyl-containing organosiloxane monomer unit (i.e. the wt % of this component relative to the total weight of the compound) ranges from 1 to 50 wt %. The preferred range is from 1 to 10 wt %.

The linear silicon-containing polymers (e.g. siloxanes or silanes) described above possess a highly robust chemical structure with exceptional thermal resistance properties. The thermal resistance can be further improved by incorporating some cross-linking agent in the polymer binder precursor. Potential cross-linking agents include tri-, tetra- or poly-methylhydrosilyl (or -vinyl) containing organosiloxane cross-linking components, which are preferably employed in the presence of a platinum catalyst system. These provide additional heat resistance performance, resulting in compositions with excellent thermal stability performance. A typical reaction scheme is shown below in Scheme 5:

Scheme 5

In this scheme P can be any suitable linking group. For example, it may be chosen such that the methylhydrosilyl component is the same as the product formed in scheme 4 above. P may be repeating unit based on any suitable group known to those in the art, for example it may consist of a polyethylene glycol-, polydimethylsiloxane- or polyterahydrofuran-based group.

The cross-linking component (alternatively called a multifunctional monomer) is a molecule which contains three or more reactive functional units. For example, these functional units may be carbon-carbon single bonds or C=C double bonds (e.g. a vinyl group), or hydrogen-silicon or carbon-silicon bonds (e.g. a methylhydrosilyl group). Each of these reactive functional units (e.g. C=C, or H—Si) can independently act as an active site and subsequently participate in the growth of the polymer chain, while the other reactive functional units can facilitate the formation of the branched polymer which grows and eventually connects to another chain in order to create a cross-linked polymer structure. Thus, the multifunctional components mentioned above are capable of producing highly cross-linked structures. Preferred cross-linking components are those having three or more reactive functional units which are either vinyl groups or methyhydrosilyl groups.

Thus, in a preferred embodiment, the present invention provides a cross-linked polycarbosiloxane polymer binder composition comprising the reaction product of:

(1) a di-, tri-, tetra-, or poly-methylhydrosilyl-containing organopolysiloxane;
(2) a di-, tri-, tetra-, or poly-vinyl-containing organopolysiloxane;
(3) a tri-, tetra-, or poly-vinyl-containing, or a tri-, tetra-, or poly-methylhydrosilyl-containing organosiloxane cross-linking component.

The cross-linking component is preferably present in liquid form, and is preferably in an amount of from 0.1 to 10 wt %, based on the total weight of the total composition.

Preferably the polymer binder composition further comprises an organometallic catalyst. Suitable catalysts include platinum catalysts, which may be selected from chloroplatinic acid or platinum vinylsiloxane complexes. Platinum complexes are particularly advantageous in that they lower the reaction temperatures required for thermal curing. The catalyst is preferably present in an amount of from 0.01 to 5 wt %, based on the total weight of the polymer.

Other Components

In addition to the polymer binder component, overvoltage protection materials of the present invention comprise a conductive material, which is preferably present in the form of conductive particles dispersed throughout the polymer matrix. The overvoltage protection materials may also include other components, for example semi-conductive materials and/or non-conductive materials.

The conductive polymeric material composite may be formed as a multifunctional polymeric composite matrix system, having three or more components. One particularly preferred system can be represented by the formula:

$$A_x B_y C_z D_n$$

where A is a polymeric binder (e.g. an insulating polymer matrix comprising silicon rubber or other type of cross-linked polymer), B is a conductive material (e.g. aluminium, nickel or iron particles), C is a non-conductive material (e.g. inorganic particles that control the spacing between the conductive particles), and D is a semi-conductive material (e.g. inorganic particles which modulate the electrical properties of the system and increase the heat dispersion effect). The nature of components A, B, C and D, and the relevant proportions of these components (represented by x, y, z and n) can be altered in order to achieve the desired overvoltage protection material.

The preferred values of x, y, z and n are those which result in a polymer matrix where A is present in an amount of from 10 to 60 wt %, B is present in an amount of from 10 to 70 wt %, C is present in an amount of from 1 to 40 wt %, and D is present in an amount of from 1 to 40 wt %.

(i) Conductive Materials

The ability of the overvoltage protection materials to protect devices from transient high voltage surges is dependent upon a number of factors, including the electrical properties of the polymeric binder, and the size of the gap between the electrodes of the resulting overvoltage protection devices. The nature of the conductive material also influences the properties of the overvoltage protection materials. For example, the electrical conductivity of the conductive material, the size of the particles of this material, and the loading of conductive material within the polymer binder (and hence the interparticle separation of the conductive material) all influence the overvoltage protection capabilities.

The conductive materials used in the present invention have bulk conductivities greater than 1000 $(\Omega \cdot cm)^{-1}$, and are preferably present in the form of conductive particles. These conductive particles generally have an average particle size (APS) of generally less than 20 microns, such as 0.1 to 20 microns, and more preferably less than 10 microns. A particularly preferred average particle size is between 1 and 10 microns. Conductive particles having average particle sizes between 1 and 30 microns are easily obtainable from commercial suppliers.

A wide range of suitable conductive particles is available. Examples include metallic particles such as aluminium, copper, gold, iron, silver, beryllium, bismuth, cobalt, magnesium, molybdenum, palladium, tantalum, tungsten and tin particles; particles of metal alloys such as stainless steel, bronze and brass; carbide powders such as carbides of titanium, boron, tungsten and tantalum; carbon-based powders such as carbon black and graphite; metal nitrides and metal borides. Recently, intrinsically conducting polymers such as polyaniline and polypyrrole have become available, and these would also be of use in the invention. Preferred conductive particles include nickel, aluminium, copper, carbon black, graphite, gold, iron, stainless steel, silver, tin and metal alloys, with nickel and aluminium being most preferred.

The conductive material may be present in any amount necessary to achieve the desired overvoltage protection capabilities. Generally it will be present in an amount of from 10 to 70 wt %, based on the total weight of the composition, more preferably from 20 to 60 wt %, most preferably 30 to 55%.

(ii) Semi-Conductive Materials

The semi-conductive materials used in the present invention generally have bulk conductivities less than 100 $(\Omega \cdot cm)^{-1}$. They are employed to modulate the electrical property of the overvoltage protection materials, and to increase the heat dispersion effect.

The materials are preferably particulate inorganic materials, and the average particle size of the semi-conductive materials is usually less than 10 microns, for example from 0.1 to 10 microns, and more preferably the average particle size is less than 2 microns, such as 0.1 to 2 microns.

Suitable semi-conductive materials include aluminium nitride, barium titanate, boron nitride, silicon nitride, titanium dioxide, silicon carbide and zinc oxide, with silicon carbide being preferred. When present in the composition, the semi-conductive materials are preferably present in an amount of from 1 to 40 wt %, based on the total weight of the composition, more preferably from 10 to 30 wt %.

(iii) Non-Conductive Materials

The non-conductive materials used in the present invention generally have bulk conductivities less than $10^{-6}$ $(\Omega \cdot cm)^{-1}$. They are employed primarily to control the spacing between particles of the conductive material.

The non-conductive materials are present in the form of particles, with the average particle size generally being less than 5 microns, for example 0.005 to 10 microns, and more preferably being within the range 0.01 to 1 micron. These materials are preferable organic materials, and are suitably selected from non-conducting materials (or inorganic fillers) including coated- or uncoated-aluminium oxide, barium oxide, silica, barium carbonate, calcium carbonate, magnesium carbonate, calcium sulphate and magnesium sulphate. Particularly preferred are silica, aluminium oxide and calcium carbonate.

When present in the composition, the non-conductive materials preferably comprise from 1 to 40 wt %, based on the total weight of the composition, more preferably from 5 to 20 wt %.

Processes for Preparing Overvoltage Protection Materials:

The overvoltage protection material of the invention may be produced according to the general processes described earlier. Due to the choice of the polymer binder precursor, substantially no solvent is generated during the curing step to form the polymer binder, and this has a number of advantages. For example, by reducing the amount of solvent generated, there is less solvent to evaporate during curing, hence less energy is required for the curing step. Also, reducing the amount of solvent generated results in a material having fewer voids in its structure. The overvoltage protection materials of the present invention preferably have substantially no voids.

The overvoltage protection materials may be prepared by a standard mixing technique of the components using conventional apparatus. A high speed (e.g. >2000 rpm) continuous stirring tank reactor is particularly suitable.

According to a preferred embodiment of the invention, there is provided a solvent free process of forming an overvoltage protection material, wherein a highly cross-linked polymer matrix is prepared having a conductive material dispersed throughout. The polymer matrix is generated from a polymer binder precursor which reacts via an addition polymerisation reaction, as described earlier. Other components, such as semi-conductive and/or non-conductive materials may also be included within resulting overvoltage protection material. This is a 'one-pot' synthetic technique, in which all the materials are mixed or blended together in a mixing vessel, and this reaction mixture is then heated in order to form the polymer binder (also called the polymer matrix) having a conductive material dispersed therein. The one-pot methodology has the advantage that it reduces the number of processing steps, and hence reduces costs. Suitable synthetic routes are shown in the Examples below.

Device Fabrication

The overvoltage protection devices of the invention may be prepared according to a process comprising depositing a metallic layer on a substrate, and etching the metallic layer in order to provide metallic electrodes separated by gaps; preparing a solvent-free mixture comprising at least one polymer binder precursor and a conductive material, and applying this mixture between and in contact with adjacent electrodes; and heating the device to cause reaction of the polymer binder precursor and generate an overvoltage protection material comprising a polymer binder having conductive material dispersed therein; wherein the polymer binder precursor is chosen such that substantially no solvent is generated during the reaction. The polymer binder precursor and conductive material are as discussed above.

The polymer binder precursor preferably reacts via an additional polymerisation reaction, and the polymer binder formed during this process is substantially free of voids. The particular components (e.g. polymer binder precursor and conductive material) used to make the device can be optimised according to the application for which the resulting device will be used. However, it is preferred to choose the components such that the overvoltage protection device has a trigger voltage of less than 300V. The devices preferably have a very fast switching time, for example less than 1 nanosecond.

The substrate and metallic layer will be chosen depending on the specific application of the device. For example, the device may be used in a semiconductor device, and the substrate may then be selected from materials known in the art to be suitable for this application. The metallic layer is preferably between about 1 to 20 microns thick, more preferably from about 5 to about 15 microns thick. The metallic materials suitable for use as the electrodes are known to those skilled in the art, and include nickel, silver and copper, with nickel and copper being preferred. The deposition step can be any conventional method for depositing a thin layer of metal onto a substrate. Possible methods include sputtering, nickel-electrodless plating, electroplating, thermal evaporation and metal-epoxy lamination.

A suitable fabrication procedure is as follows. A thin metallic layer is coated onto a substrate surface by any suitable method, such as sputtering, thermal evaporation or electroplating. Alternatively, a commercially available copper laminated board, where a layer of copper is already present on a substrate, may be used. Exemplary substrates include, but are not limited to, laminated epoxy fibre glass (e.g. FR4), glass and ceramics.

The device pattern is formed on the surface of the device by a number of suitable procedures, for example by lithographic patterning or wet etching. The resulting gaps between the electrodes are generally of the order of microns, for example between 10 and 1000 microns. A preferred electrode separation is between 10 and 200 microns, more preferably between 30 and 150 microns.

Figure 2:
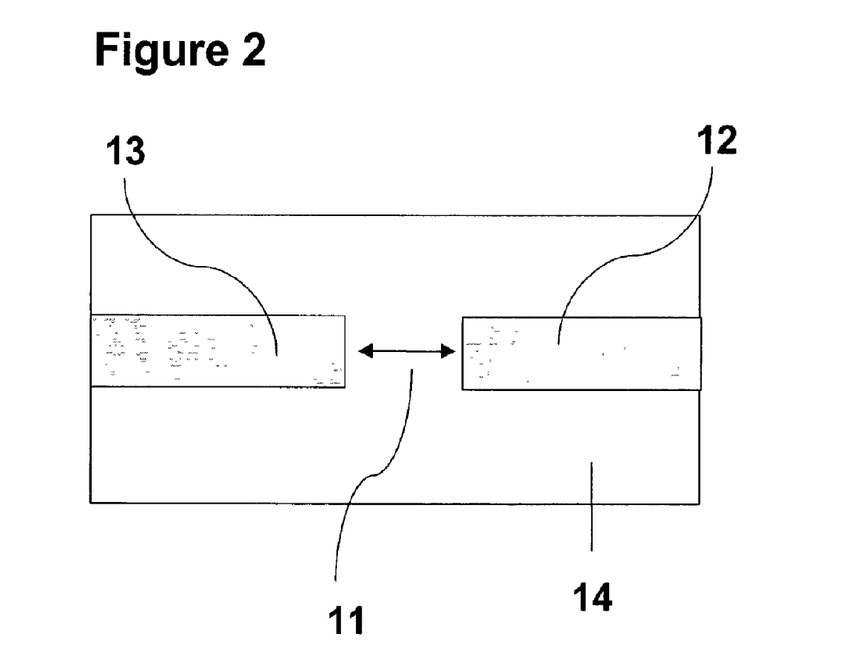
FIG. 2 is a plan view of an overvoltage protection device substrate without an overvoltage protection material.

An exemplary device, prior to addition of the overvoltage protection material, is shown in FIG. 2, which depicts two electrodes (12, 13) on a substrate (14). The electrodes are separated by micro-gap (11).

Once the basic device structure has been fabricated, the solvent-free mixture, comprising the polymer binder precursor and the conductive material, can be applied onto the above mentioned device by a number of dispensing methods such as hand brushing, screen printing and others casting procedure. Hand brushing is used in the following examples, although screen printing is preferred for large-scale production. After the material has been applied to the device, the polymer binder must be cured in order to form the final overvoltage protection device. Suitable curing conditions will be known to those skilled in the art, but temperatures of between 40 and 150° C., more preferably between 25 and 100° C., have been found to be particularly suitable for making devices according to the invention.

Figure 1:
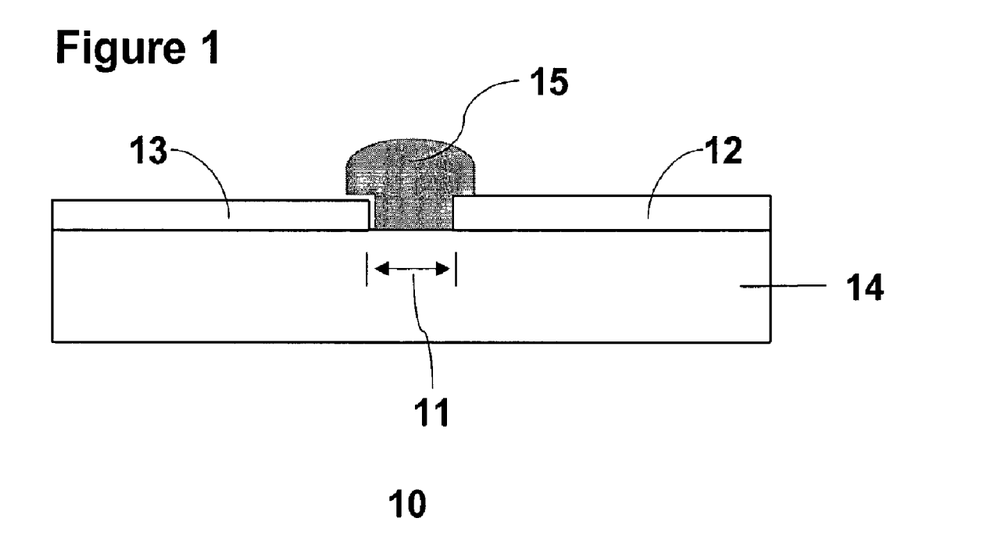
FIG. 1 is a cross-sectional view of an overvoltage protection device 10.
Figure 3:
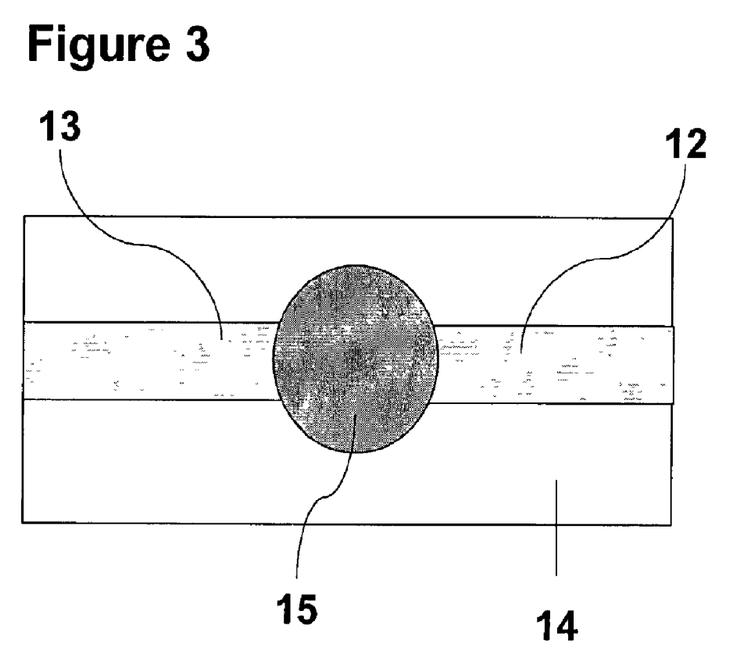
FIG. 3 is a plan view of an overvoltage protection device containing an overvoltage protection material 15.

The finished device (10), after addition of the overvoltage protection material (15), is shown in FIG. 1 (cross-sectional view) and FIG. 3 (plan view).

The overvoltage protection device may be fabricated as part of a larger circuit. For example, the invention provides a circuit comprising electronic components, at least a first and second conducting region, an amount of an overvoltage protection material being disposed between and in contact with said conducting regions.

The following Examples are intended to illustrate the present invention, and are not intended to limit the invention in any way.

EXAMPLES

Figure 4:
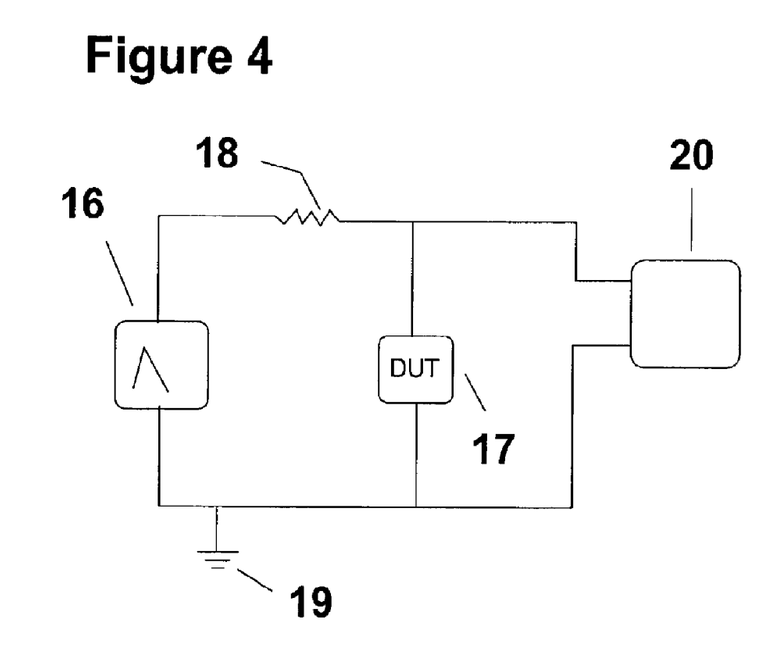
FIG. 4 is a diagram of a testing circuit for measuring the electrical properties of the overvoltage protection materials according to the present invention.

A number of formulations were been prepared by a mixing technique which is described in the examples below. After curing of the overvoltage protection material, devices comprising these materials were tested. In particular, the devices were tested to determine: (1) electrical resistance; (2) trigger voltage (using the Human Body Model (HBM), a standard methodology for generating a transient voltage, in which the voltage is generated by an ionised Charge Plate); (3) leakage current (recorded by Current-Voltage (I-V) method) measured by scanning a voltage between 0 to 24 V (d.c.) through the overvoltage protection device and then taking the current reading at 12V; and (4) capacitance (measured at 1 MHz frequency). The devices were tested using an electrical circuit as shown in FIG. 4, in order to determine the trigger voltage. FIG. 4 depicts a pulse generator (16), an overvoltage protection device according to the invention (17), a resistor (18), a ground (19) and a high speed oscilloscope (20).

Example 1

A conductive polymeric composite material comprising polyurethane as a polymeric binder was prepared according to the following formulation:

| | |
|---|---|
| Poly(1,4-butanediol), isophorone diisocyanate terminated | 24.5 wt % |
| Terathane 650, polyester glycol | 5 wt % |
| Polycaprolactone triol, Mw ~300 | 0.5 wt % |
| Dibutytin dilaurate | 0.6 wt % |
| Nickel powder, APS 2.2–3.0 micron | 45 wt % |
| Calcium carbonate powder, APS 40 nm | 5 wt % |
| Silicon carbide (12S), APS 0.7 micron | 20 wt % |

In a typical preparation procedure using a polyurethane polymeric binder, poly(1,4-butanediol), isophorone diisocyanate terminated, Terathane 650 polyester glycol, polycaprolactone triol, nickel powder, calcium carbonate powder and silicon carbide powder were mixed in a round bottomed flask and stirred with mechanical stirrer for 10-20 minutes until the materials were well mixed using a high speed (e.g. >2000 rpm) continuous stirring tank reactor, and a viscous material was obtained. Then, a catalytic amount of dibutyltin dilaurate (e.g. 0.6 wt % based on the polymer content) was added into the well mixed viscous mixture, and the composition was stirred at room temperature for a further 10-15 minutes.

The resulting viscous material was cast onto the gap between electrodes on a device as shown in FIG. 1 by a normal hand casting method. The device was then placed in a conventional hot-air oven at 80° C. to cure the polymer. After about 30 minutes curing the overvoltage protection device was removed and its electrical properties measured as described above. The results are shown below in Table 1.

Example 2

A conductive polymeric composite material was prepared according to the following formulation:

| | |
|---|---|
| Poly(dimethylsiloxane-co-methylhydrosiloxane) | 38.25 wt % |
| Polydimethylsiloxane, vinyldimethyl terminated | 4.5 wt % |
| 1,3,5,7-Tetramethylcyclotetrasiloxane | 2.25 wt % |
| Platinum vinylsiloxane catalyst (Pt 0.1 wt %) | 1.3 wt % |
| Aluminium powder, APS 6.0 micron | 40 wt % |
| Calcium carbonate powder, APS 40 nm | 7.5 wt % |
| Alumina, AKP20, APS 0.3–0.6 micron | 7.5 wt % |

In a typical preparation procedure, poly(dimethylsiloxane-co-methylhydrosiloxane), polydimethylsiloxane (vinyldimethyl terminated), 1,3,5,7-tetramethylcyclotetrasiloxane, aluminium powder, calcium carbonate powder and alumina powder were mixed in a round bottom flask and stirred with mechanical stirrer for 10-20 minutes at 60° C. until the materials were well mixed. Then, a catalytic amount of platinum vinylsiloxane containing 0.1 wt % platinum (e.g. ~1 wt % based on polymer content) was added into the well mixed viscous mixture. The mixture was stirred at room temperature for a further 10-15 minutes.

The resulting viscous material was cast onto the gap between electrodes on a device as shown in FIG. 1 by a normal hand casting method. The device was then placed in a conventional hot-air oven at 80° C. to cure the polymer. After about one hour of curing the overvoltage protection device was removed and its electrical properties measured as described above. The results are shown below in Table 1, from which it can be seen that the overvoltage protection device had essentially the same characteristics as the overvoltage protection device in Example 1.

Example 3

A conductive polymeric composite material was prepared according to the following formulation:

| | |
|---|---|
| Poly(dimethylsiloxane-co-methylhydrosiloxane) | 38.25 wt % |
| Polydimethylsiloxane, vinyldimethyl terminate | 4.5 wt % |
| 1,3,5,7-Tetramethylcyclotetrasiloxane | 2.25 wt % |
| Platinum vinylsiloxane catalyst (Pt 0.1 wt %) | 1.3 wt % |
| Nickel powder, APS 2.2–3.0 micron | 33 wt % |
| Calcium carbonate powder, APS 40 nm | 11 wt % |
| Alumina, AKP20, APS 0.3–0.6 micron | 11 wt % |

Exactly the same procedure was used as described above in Example 2, but using the formulation above, where nickel powder with APS 2.2-3.0 micron was used instead of aluminium powder. After curing, the resulting overvoltage protection device had essentially the same characteristics as the protection device in Example 1 (see Table 1).

Example 4

A conductive polymeric composite material was prepared according to the following formulation:

| | |
|---|---|
| Poly(dimethylsiloxane-co-methylhydrosiloxane) | 30 wt % |
| Polydimethylsiloxane, vinyldimethyl terminate | 10 wt % |
| Platinum vinylsiloxane catalyst (Pt 0.1 wt %) | 1.3 wt % |
| Aluminium powder, APS 6.0 micron | 50 wt % |
| Calcium carbonate powder, APS 40 nm | 5 wt % |
| Silicon carbide (7S), APS | 5 wt % |

Again, the procedure described in Example 2 was followed, but in this example, the formulation contained an additional component of silicon carbide powder. The electrical properties of the resulting device are shown in Table 1. The overvoltage protection material composite was a little softer than the composites of Examples 2 and 3 because an additional crossing linking agent was omitted from the formulation Example 5

A conductive polymeric composite material was prepared according to the following formulation:

| | |
|---|---|
| Poly(dimethylsiloxane-co-methylhydrosiloxane) | 27.8 wt % |
| Polydimethylsiloxane, vinyldimethyl terminate | 9.2 wt % |
| Platinum vinylsiloxane catalyst (Pt 0.1 wt %) | 1.3 wt % |

-continued

| | |
|---|---|
| Aluminium powder, APS 6.0 micron | 50 wt % |
| Calcium carbonate powder, APS 40 nm | 6.5 wt % |
| Silicon carbide (7S), APS | 6.5 wt % |

The procedure of Example 2 was again followed, but with a different formulation. After curing, the electrical properties of the resulting overvoltage protection device were measured, and the results are shown below in Table 1.

Example 6

A conductive polymeric composite material was prepared according to the following formulation:

| | |
|---|---|
| Poly(dimethylsiloxane-co-methylhydrosiloxane) | 26.25 wt % |
| Polydimethylsiloxane, vinyldimethyl terminate | 8.75 wt % |
| Platinum vinylsiloxane catalyst (Pt 0.1 wt %) | 1.3 wt % |
| Aluminium powder, APS 6.0 micron | 50 wt % |
| Calcium carbonate powder, APS 40 nm | 7.5 wt % |
| Silicon carbide (7S), APS | 7.5 wt % |

The procedure of Example 2 was again followed, but with a different formulation. After curing, the electrical properties of the resulting overvoltage protection device were measured, and the results are shown below in Table 1.

Example 7

A conductive polymeric composite material was prepared according to the following formulation:

| | |
|---|---|
| Poly(dimethylsiloxane-co-methylhydrosiloxane) | 26.25 wt % |
| Polydimethylsiloxane, vinyldimethyl terminate | 8.75 wt % |
| Platinum vinylsiloxane catalyst (Pt 0.1 wt %) | 1.3 wt % |
| Aluminium powder, APS 6.0 micron | 50 wt % |
| Calcium carbonate powder, APS 40 nm | 10 wt % |
| Silicon carbide (7S), APS | 5 wt % |

The procedure of Example 2 was again followed, but with a different formulation. After curing, the electrical properties of the resulting overvoltage protection device were measured, and the results are shown below in Table 1.

Example 8

| | |
|---|---|
| A conductive polymeric composite material was prepared | 26.25 wt % |
| Polydimethylsiloxane, vinyldimethyl terminate | 8.75 wt % |
| Platinum vinylsiloxane catalyst (Pt 0.1 wt %) | 1.3 wt % |
| Aluminium powder, APS 6.0 micron | 50 wt % |
| Calcium carbonate powder, APS 40 nm | 11.28 wt % |
| Silicon carbide (7S), APS | 3.72 wt % |

The procedure of Example 2 was again followed, but with a different formulation. After curing, the electrical properties of the resulting overvoltage protection device were measured, and the results are shown below in Table 1.

TABLE 1

| Example No. | Trigger Voltage (V) | Resistance off state (GΩ) (@ 6 V) | Response Time (ns) | Leakage current (nA) (@12 VDU) | Capacitance (PF) (@1 MHz) | Gap between electrodes (μm) |
|---|---|---|---|---|---|---|
| 1 | 214 | 6 | <1 | <1 | 0.40 | 35 |
| 2 | 192 | 142 | <1 | <1 | 0.20 | 140 |
| 3 | 259 | 160 | <1 | <1 | 0.14 | 100 |
| 4 | 240 | 3 | <1 | ~0.001 | 0.55 | 60 |
| 5 | 213 | 1 | <1 | ~0.014 | 0.50 | 35 |
| 6 | 200 | 1 | <1 | ~0.025 | 0.43 | 35 |
| 7 | 186 | 121 | <1 | ~0.033 | 0.44 | 35 |
| 8 | 207 | 138 | <1 | ~0.010 | 0.47 | 35 |

The preceding examples describe the starting mixtures, preparation methods and process conditions used, and the characteristics of the resulting conductive polymeric composite materials, as normal fabrication procedures according to the present invention. These examples are illustrative of but a few of the many possible permutations of chemicals and process parameters that could be used to prepare conductive polymeric composite materials of the invention.

The foregoing is offered primarily for the purposes of illustration. It will be readily apparent to those skilled in the art that numerous variations, modifications and substitutions may be made in the materials, procedural steps and conditions described herein without departing from the spirit and scope of the invention.

The invention claimed is:

1. An overvoltage protection material, comprising:
   polymer binder precursor including a hydrosilane and a vinylsilane; and
   a conductive material dispersed in the polymer binder precursor;
   wherein the hydrosilane and the vinylsilane are chosen such that a mixture comprising the polymer binder precursor and the conductive material forms a final reaction product that is substantially solvent-free, generates substantially no solvent, and forms substantially no voids.

2. The overvoltage protection material of claim 1, wherein the hydrosilane is selected from the group consisting of 1,1-dimethyl-3,3-diphenyldisiloxane, dihydride terminated poly (dimethylsiloxane), dihydride terminated poly(dimethylsiloxane-co-diphenylsiloxane), dihydride terminated poly (dimethylsiloxane-co-methylphenylsiloxane), methyl terminated poly(dimethylsiloxane-co-methylhydrosiloxane)

trimethylsilyl terminated poly(dimethylsiloxane-co-methylhydrosiloxane), and hydride terminated poly(dimethylsiloxane-co-methylhydrosiloxane).

3. The overvoltage protection material of claim 1, further comprising a catalyst reactive with the polymer binder precursor to form, via a hydrosilylation reaction between the hydrosilane and the vinylsilane, the final reaction product.

4. The overvoltage protection material of claim 3, wherein the final reaction product is a polycarbosilane.

5. The overvoltage protection material of claim 1, wherein the conductive material comprises a metal selected from the group consisting of nickel, aluminum, copper, gold, iron, silver, beryllium, bismuth, cobalt, magnesium, molybdenum, palladium, tantalum, tungsten, and tin.

6. The overvoltage protection material of claim 1, wherein the conductive material comprises a metal alloy selected from the group consisting of stainless steel, bronze, and brass.

7. The overvoltage protection material of claim 1, wherein the conductive material comprises a carbide selected from the group consisting of titanium carbide, boron carbide, tungsten carbide, and tantalum carbide.

8. The overvoltage protection material of claim 1, wherein the conductive material comprises carbon black or graphite.

9. The overvoltage protection material of claim 1, wherein the conductive material comprises a metal nitride or a metal boride.

10. The overvoltage protection material of claim 1, wherein the conductive material comprises a conductive polymer.

11. The overvoltage protection material of claim 10, wherein the conductive polymer comprises polyaniline or polypyrrole.

12. The overvoltage protection material of claim 1, further comprising a non-conductive material and a semi-conductive material.

13. The overvoltage protection material of claim 12, wherein the conductive material has a bulk conductivity of greater than 1000 $(\Omega \cdot cm)^{-1}$, the semi-conductive material has a bulk conductivity of less than 100 $(\Omega \cdot cm)^{-1}$, and the non-conductive material has a bulk conductivity of less than $10^{-6}$ $(\Omega \cdot cm)^{-1}$.

14. The overvoltage protection material of claim 12, wherein the polysilane binder is present in an amount from 10 to 60 wt. %, the conductive material is present in an amount from 10 to 70 wt. %, the non-conductive material is present in an amount from 1 to 50 wt. %, and the semi-conductive material is present in an amount from 1 to 40 wt. %.

15. The overvoltage protection material of claim 12, wherein the semi-conductive material is in the form of particles having an average particle size of from about 0.1 to 10 microns.

16. The overvoltage protection material of claim 15, wherein the semi-conductive particles are present in an amount of from about 1 to 40 wt. %, based on the total weight of the overvoltage protection material.

17. The overvoltage protection material of claim 12, wherein the non-conductive material is in the form of particles having an average particle size of from about 0.005 to 10 microns.

18. The overvoltage protection material of claim 17, wherein the non-conductive particles are present in an amount of from 1 to 40 wt. %, based on the total weight of the overvoltage protection material.

19. The overvoltage protection material of claim 1, wherein the overvoltage protection material has a trigger voltage of less than 300 V.

20. The overvoltage protection material of claim 1, wherein the vinylsilane is selected from the group consisting of 1,3-divinyl-1,1,3,3-tetramethyldisiloxane, 1,3-divinyl-1,1,3,3-tetraphenyldisiloxane, 1,3-divinyl-1,3-dimethyl-1,3-diphenyldisiloxane, 1,3-divinyl- 1,1-dimethyl-3,3-diphenyldisiloxane, divinyl terminated poly(dimethylsiloxane), divinyl terminated poly(dimethylsiloxane-co-diphenylsiloxane), and divinyl terminated poly(dimethylsiloxane-co-methylphenylsiloxane).

21. The overvoltage protection material of claim 1, wherein the conductive material is in the form of conductive particles having an average particle size of from about 0.1 to 20 microns.

22. The overvoltage protection material of claim 21, wherein the conductive particles are present in an amount of from 10 to 60 wt %, based on the total weight of the overvoltage protection material.

* * * * *